United States Patent
Mineji

[11] Patent Number: 5,807,770
[45] Date of Patent: Sep. 15, 1998

[54] FABRICATION METHOD OF SEMICONDUCTOR DEVICE CONTAINING SEMICONDUCTOR ACTIVE FILM

[75] Inventor: Akira Mineji, Tokyo, Japan

[73] Assignee: NEC Corporation, Japan

[21] Appl. No.: 614,393

[22] Filed: Mar. 12, 1996

[30] Foreign Application Priority Data

Mar. 13, 1995 [JP] Japan ..................................... 7-052699

[51] Int. Cl.[6] .......................... H01L 21/336; H01L 21/84
[52] U.S. Cl. .......................... 438/151; 438/586; 438/595; 438/664; 438/655; 438/682; 438/683; 438/152
[58] Field of Search ..................................... 438/149, 151, 438/164, 586, 595, 682, 683, 664, 655, 152

[56] References Cited

U.S. PATENT DOCUMENTS

| | | | |
|---|---|---|---|
| 5,252,502 | 10/1993 | Havemann | 438/151 |
| 5,407,837 | 4/1995 | Eklund | 438/164 |
| 5,449,642 | 9/1995 | Tan et al. | 438/682 |

FOREIGN PATENT DOCUMENTS 2-96375  4/1990  Japan .

*Primary Examiner*—Mary Wilczewski
*Attorney, Agent, or Firm*—Hayes, Soloway, Hennessey, Grossman & Hage, P.C.

[57] ABSTRACT

A fabrication method of a semiconductor device that enables to produce a thin film of a refractory-metal silicide at a semiconductor active film without raising any defects such as agglomeration, cracks and voids. A semiconductor active film with a thickness of at most 500 Å is formed on an insulating substructure. A gate insulator film and a gate electrode are formed on the active film. An impurity is selectively doped into the active film to form source and drain regions. The remaining semiconductor active film between the source and drain regions constitutes a channel region. A refractory-metal film is formed to cover the gate electrode and the source and drain regions and is heat-treated, producing first and second silicide films through silicidation reaction of the semiconductor active film with the refractory-metal film as parts of the source and drain regions. Preferably, the refractory-metal film has a thickness of ($\frac{1}{2}$) to ($\frac{1}{8}$) times as much as that of the semiconductor active film.

17 Claims, 9 Drawing Sheets

FABRICATION METHOD OF SEMICONDUCTOR DEVICE CONTAINING SEMICONDUCTOR ACTIVE FILM

BACKGROUND OF THE INVENTION

1. Field of the Invention

The present invention relates to a fabrication method of a semiconductor device and more particularly, to a fabrication method of a semiconductor device containing a semiconductor active film, which is preferably used for fabricating a thin-film transistor (TFT) or a metal-oxide-semiconductor field-effect transistor (MOSFET) with the silicon-on-insulator (SOI) structure. These devices are applicable to a liquid crystal display (LCD), a load for a static random access memory (SRAM), and so on.

2. Description of the Prior Art

Conventionally, with a polysilicon TFT or an MOSFET with the SOI structure, each of which has a semiconductor active film where a source region, a drain region and a channel region is formed, the thickness of the active film has been relatively increasing with the decreasing size or dimension of these semiconductor devices. Thus, when a voltage is applied across the source and drain regions formed apart from each other in the semiconductor active film, the depletion region generated in the active film near the drain region tends to extend toward the source region and as a result, the so-called "short-channel effects" occurs more readily. The "short-channel effects" includes reduction of the threshold voltage, degradation of the source-to-drain withstand voltage, the punch-through phenomenon, and so on.

Also, the impact ionization multiplication tends to be caused by the carriers accelerated by the electric-field in the channel. The carriers are then accumulated in the active film to raise the channel potential, thereby causing the operation of a parasitic lateral bipolar transistor. Consequently, the source-to-drain withstand voltage of the TFT or MOSFET degrades further.

To avoid such short-channel effects as above, it is a useful measure to decrease the thickness of the semiconductor active film. In this case, when a gate voltage is applied to the gate electrode, the depletion region generated in the channel region tends to sufficiently extend in the direction perpendicular to the active film (i.e., in the film-thickness or channel-depth direction). This means that the entire channel region is readily depleted by the applied gate voltage. Accordingly, the component of the electric-field in the film-thickness direction is drastically relaxed, thereby improving the source-to-drain withstand voltage.

The thickness decrease of the semiconductor active film further provides reduction of the p-n junction capacitance, improvement of the subthreshold characteristics, and so on.

Next, a TFT used for driving an active-matrix addressing LCD is described below, in which the TFT is typically formed on a transparent panel such as a glass panel. When the panel is irradiated by incident light, the light passes through the pixel area of the panel. Then, the light enters a prism placed in the optical path of the light. A part of the light may be reflected by the prism to enter the channel region of the TFT. The light thus entering the channel region increases a leakage current (i.e., OFF-current) flowing through the TFT due to optical excitation during the OFF time. This leakage current increase badly affects the switching characteristics of the TFT, thereby raising a problem in that the quality of an image to be produced degrades.

To avoid such image-quality degradation problems, a light screening film may be provided in the optical path of the incident light to prevent the light from irradiating the channel region. However, this screening film increases the number of the necessary fabrication process steps of the LCD.

On the other hand, since the leakage current generated by the leaked incident light relates to the thickness of the channel region, the leakage current increase can be restrained to the level where the resultant leakage current does not affect the switching characteristics of the TFT if the channel region is sufficiently thin. In other words, if the thickness of the semiconductor active film of the TFT is reduced to a sufficiently low value such as 500 Å or less, the performance of the TFT can be improved so that the light screening film is not required. Therefore, the fabrication sequence of the LCD is simplified and the number of the fabrication process steps thereof is advantageously reduced.

As described above, it is seen that the thickness reduction of the semiconductor active film is advantageous for both the SOI-structured MOSFET and the TFT. However, if the thickness of the semiconductor active film is reduced to a specified value, for example, if it is reduced to 500 Å or less in the case of the polysilicon active film, the sheet resistance of the source and drain regions becomes remarkably large. As a result, a problem results in that the ON-current of the TFT decreases. In other words, the driving performance of the TFT degrades.

To solve this problem relating to the sheet-resistance increase, it is a useful measure that silicide films of refractory metals such as titanium (Ti) are formed as respective parts of the source and drain regions, because the silicide films have a lower sheet resistance than that of a polysilicon film.

In this case, however, another problem is that the entire semiconductor active film tends to be silicified because of its small thickness occurs. This means that the contact areas of the silicide films with the remaining silicon source and drain regions becomes extremely small. As a result, there arises a danger that (a) the ON-current of the TFT does not have a satisfactorily large value, (b) the silicide films contain agglomeration and/or cracks, and (c) voids are generated at the interfaces of the silicide films and the remaining source and drain regions.

FIGS. 1 and 2 show a conventional semiconductor device containing an MOSFET with the SOI structure, in which silicide films of a refractory metal are formed as respective parts of the source and drain regions. This device was disclosed in the Japanese Non-Examined Patent Publication No. 2-96375 published in April 1990.

In FIGS. 1 and 2, an insulator film 102 is formed on a silicon substrate 101. A single-crystal silicon film 104 as a semiconductor active film is formed on the insulator film 102. An isolation insulator film 103 is selectively formed on the insulator film 102 to laterally isolate the MOSFET from the other devices provided at the same silicon film 104.

A source region 105A and a drain region 105B of the MOSFET are formed to be apart from each other in the silicon film 104. The remaining part of the film 104 between the source region 105A and the drain region 105B is a channel region 106 in which a conductive channel is formed. A titanium silicide ($TiSi_2$) film 107A is selectively formed in the upper part of the source region 105A. A $TiSi_2$ film 107B is selectively formed in the upper part of the drain region 105B.

A gate insulator film 108 is selectively formed on the silicon film 104 right over the channel region 106. A gate electrode 109 is formed on the gate insulator film 108. A TiSi$_2$ film 110 is selectively formed in the upper part of the gate electrode 109.

A pair of insulating sidewall spacers 111A and 111B made of an oxide are formed on the silicon film 104 at each side of the gate electrode 109. The pair of sidewall spacers 111A and 111B cover the source- and drain-side faces of the gate electrode 109, respectively.

An interlayer insulator film 112 is formed to cover the source and drain regions 105A and 105B, the gate electrode 109 and the exposed isolation insulator film 103. The film 112 has penetrating contact holes 113A and 113B placed over the TiSi$_2$ films 107A and 107B, respectively.

Wiring or interconnection conductors 114A and 114B are formed on the interlayer insulator film 112. The conductors 114A and 114B are contacted with the TiSi$_2$ films 107A and 107B through the corresponding contact holes 113A and 113B, respectively.

As shown in FIG. 1, since the TiSi$_2$ films 107A and 107B have a thickness less than that of the silicon film 104, the contact areas of the TiSi$_2$ films 107A and 107B with the remaining silicon film 104 are sufficiently large. As a result, the contact resistance therebetween can be reduced to a satisfactory value.

With the conventional semiconductor device shown in FIGS. 1 and 2, however, if the thickness of the silicon film 104 is small (for example, it is 500 Å or less), there will arise the same danger of (a), (b) and (c) as described above. No detailed or specific formation method of the TiSi$_2$ films 107A and 107B was disclosed nor taught in the above Japanese Non-Examined Patent Publication No. 2-96375 for this case.

SUMMARY OF THE INVENTION

Accordingly, an object of the present invention is to provide a fabrication method of a semiconductor device in which a thin film of a refractory-metal silicide can be produced at a semiconductor active film without generating any defects such as agglomeration, cracks and voids.

Another object of the present invention is to provide a fabrication method of a semiconductor device in which the electric resistance reduction of source and drain regions formed in a thin semiconductor active film is ensured and realized.

The above objects together with others not specifically mentioned will become clear to those skilled in the art from the following description.

A fabrication method of a semiconductor device according to the present invention includes the following steps.

First, a semiconductor active film is formed on an insulating substructure. The semiconductor active film has a thickness of at most 500 Å. The substructure may be made of an insulating substrate or a combination of a substrate and a base insulating film formed on or over the substrate.

Next, a gate insulator film is selectively formed on the semiconductor active film. A gate electrode is formed on the gate insulator film.

An impurity is selectively doped into the semiconductor active film to form a source region and a drain region at each side of the gate electrode. The remaining semiconductor active film between the source region and the drain region constitutes a channel region.

A refractory-metal film is formed to cover the gate electrode, the source region and the drain region. The refractory-metal film has a thickness less than that of the semiconductor active film. The refractory-metal film is heat-treated to produce a first silicide film and a second silicide film through a silicidation reaction of the semiconductor active film with the refractory-metal film. The first silicide film and the second silicide film constitute parts of the source region and the drain region, respectively.

With the fabrication method according to the present invention, the source region and the drain region are formed in the semiconductor active film, and the remaining semiconductor active film between the source region and the drain region constitutes the channel region, The semiconductor active film has a thickness of 500 Å or less. Therefore, the channel region also has a thickness of 500 Å or less.

Typically, a depletion region generated in the channel region by an applied gate voltage extends for approximately 800 Å around. Therefore, if the channel region has a thickness of over 500 Å, the entire channel region may not be depleted. In this case, a problem is that a back channel is generated in the semiconductor active film to thereby increase both the leakage current (i.e., OFF-current) and the threshold voltage change occurs.

With the method of the present invention, since the channel region has a thickness of 500 Å or less, the above problem due to the back channel does not occur.

Further, since the refractory-metal film has a thickness less than that of the semiconductor active film, the first silicide film and the second silicide film can be produced without raising any defects such as agglomeration, cracks and voids, even if the semiconductor active film has a thickness of 500 Å or less. This means that the electric resistance reduction of the pair of source/drain regions is ensured and realized.

In a preferred embodiment of the invention, the semiconductor active film has a thickness ranging from 500 Å to 250 Å. If the thickness of the active film is less than 250 Å, the thickness of the first and second silicide films needs to be less than that or the semiconductor active film, which is extremely difficult to achieve. Additionally, the electric resistance of the channel region becomes disadvantageously high.

In another preferred embodiment of the invention, the refractory-metal film has a thickness of (½) to (⅕) times as much as that of the semiconductor active film. If the thickness of the refractory-metal film is greater than (½) times as much as that of the semiconductor active film, a danger that the semiconductor active film is entirely silicified, becomes high.

If the thickness of the refractory-metal film is less than (⅕) times as much as that of the semiconductor active film and is less than 50 Å, the silicidation reaction of the semiconductor active film and the refractory-metal film may not progress satisfactorily. This means that the resistance of the source region and the drain region cannot be reduced as required.

In still another preferred embodiment of the invention, the step of heat-treating the refractory metal film is performed in an atmosphere of nitrogen (N$_2$) or an inert gas such as argon (Ar) at a temperature ranging from 600° C. to 900° C. The atmosphere of nitrogen or an inert gas is employed to prevent the first silicide film and the second silicide from being oxidized during the silicidation reaction.

The temperature ranging from 600° C. to 900° C. is employed to obtain sufficiently low resistance of the first silicide film and the second silicide film. Specifically, if the temperature is lower than 600° C., the silicidation reaction does not progress sufficiently. If the temperature is higher than 900° C., the first and second silicide films tend to be broken or cut due to agglomeration, thereby increasing the electric resistance of the first and second silicide films and/or damaging the thickness uniformity thereof.

Any refractory-metal film may be used as the refractory-metal film. However, the refractory-metal film is preferably made of at least one selected from the group consisting of Ti, Cr, Co, Ni, Nb, Mo, Pd, Ta and W. Within this group, Co is more preferable because it facilitates the formation of the thin first and second silicide films.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
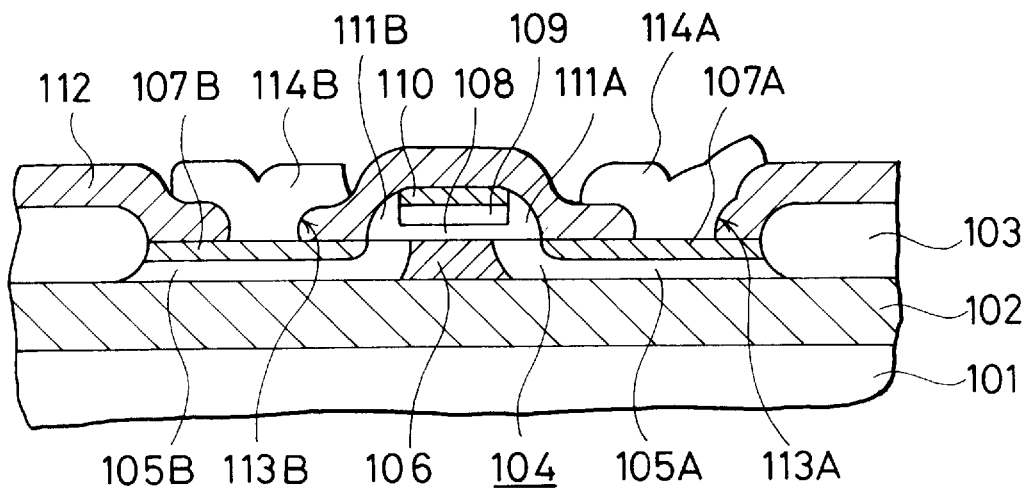
FIG. 1 is a partial cross-sectional view along the line I—I in FIG. 2, which shows a conventional semiconductor device having an MOSFET with the SOI structure.
Figure 2:
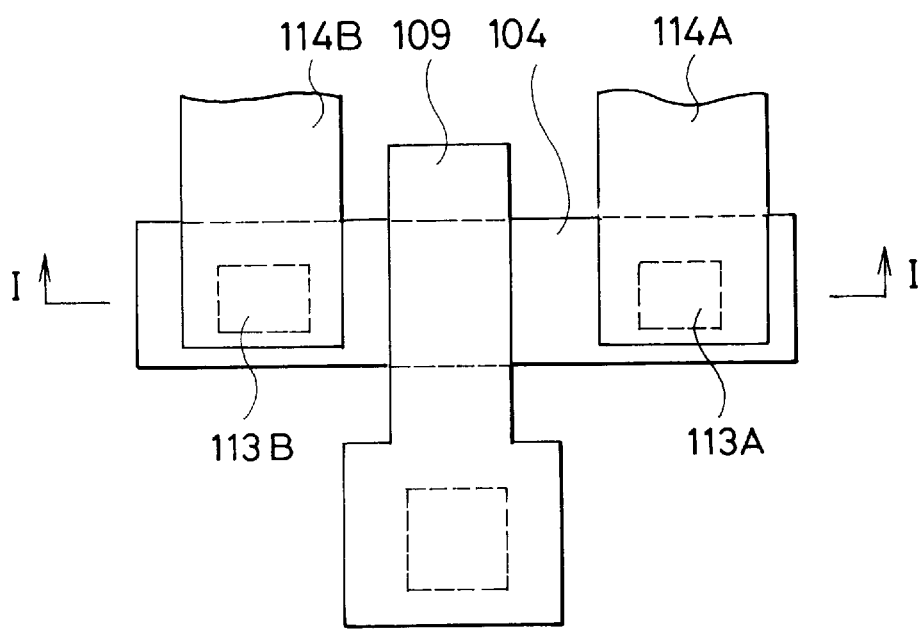
FIG. 2 is a schematic partial plan view of the conventional semiconductor device shown in FIG. 1.

Preferred embodiments of the present invention will be described in detail below while referring to the drawings attached.

FIRST EMBODIMENT

In a fabrication method of a semiconductor device according to a first embodiment of the invention, the following process steps are performed. Here, the device is a polysilicon TFT.

Figure 3A:
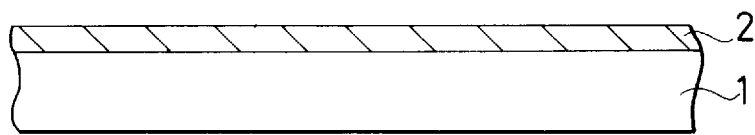
FIGS. 3A to 3G are partial cross-sectional views showing a fabrication method of a semiconductor device according to a first embodiment of the invention, respectively.

First, as shown in FIG. 3A, an amorphous silicon film with a thickness of approximately 300 Å is deposited on a quartz glass substrate 1 at a temperature of 450° C. to 550° C. by a low pressure chemical vapor deposition (LPCVD) process. As the source material of the amorphous silicon film, silane or disilane is used.

The glass substrate 1 constitutes an insulating substructure in this embodiment.

Next, the amorphous silicon film is heat-treated at a temperature of approximately 600° C. in a $N_2$ atmosphere for annealing, thereby growing in a solid phase a polycrystalline silicon. (i.e., polysilicon) film 2 on the substrate 1, as in FIG. 3A. The polysilicon film 2 has a thickness of 300 Å and serves as a "semiconductor active film".

Figure 3B:
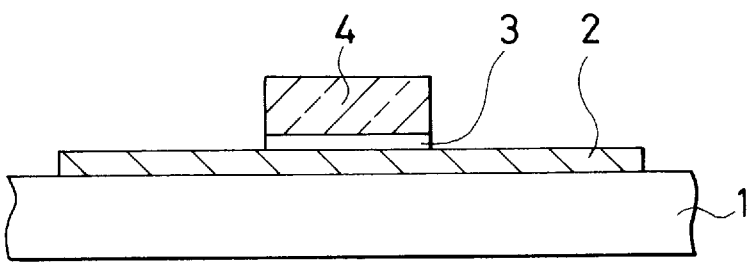

The polysilicon film 2 is then patterned to laterally isolate a device region for the TFT from the other devices provided at the same polysilicon film 2. A gate insulator film 3 is selectively formed on the patterned polysilicon film 2 and a gate electrode 4 is formed on the gate insulator film 3. The state at this stage is shown in FIG. 3B.

Figure 3C:
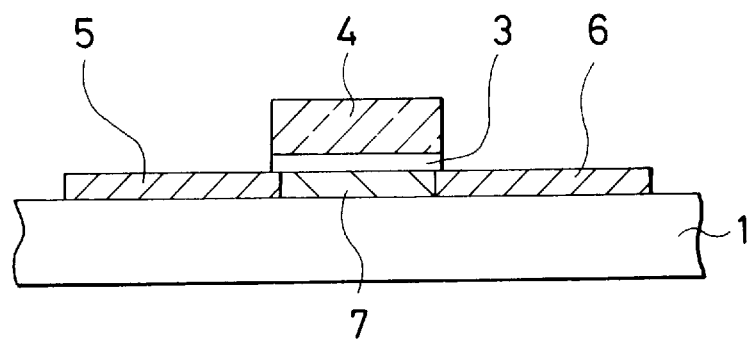

An impurity is selectively ion-implanted into the polysilicon film 2 using the gate electrode 4 as a mask. Thus, a source region 5 and a drain region 6 are formed to be apart from each other in the polysilicon film 2, as shown in FIG. 3C. The source and drain regions 5 and 6 are formed in self alignment to the gate electrode 4.

The dose of the impurity or dopant ions is, for example, as high as $1 \times 10^{15}$ atoms/cm$^2$. The doping concentration of the source and drain regions 5 and 6 is, for example, as high as $1 \times 10^{20}$ atoms/cm$^3$. As the doped impurity for the ion-implantation process, Arsenic (As) or phosphorus (P) is used for an n-type TFT, and boron (B) or boron fluoride ($BF_2$) for a p-type TFT.

Here, although the gate electrode 4 is used as the mask, it is needless to say that a masking film such as a patterned photoresist film may be formed to cover the gate electrode 4 and the exposed polysilicon film 2. The patterned photoresist film may be produced by a photolithography process.

Figure 3D:
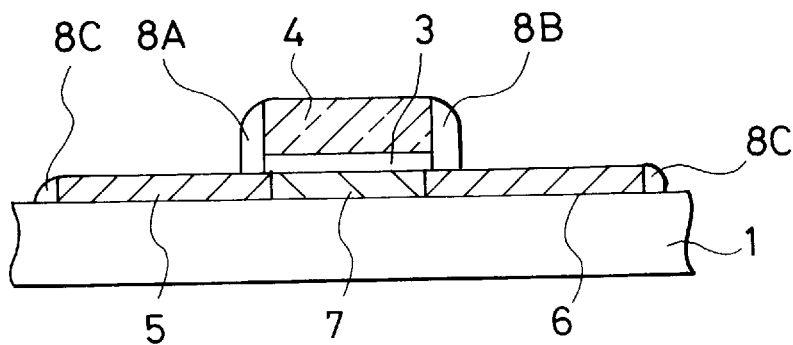

Subsequently, a silicon dioxide ($SiO_2$) film (not shown) is formed to cover the entire substrate 1 and then, the $SiO_2$ film is etched back by an anisotropically dry etching process. Thus, as shown in FIG. 3D, a pair of $SiO_2$ sidewall spacers 8A and 8B are formed on the polysilicon film 2 at each side of the gate electrode 4. During this etch back process, the $SiO_2$ film remains in the periphery of the patterned polysilicon film 2. Therefore, the outer edge of the polysilicon film 2 is covered with the remaining $SiO_2$ film 8C.

Figure 3E:
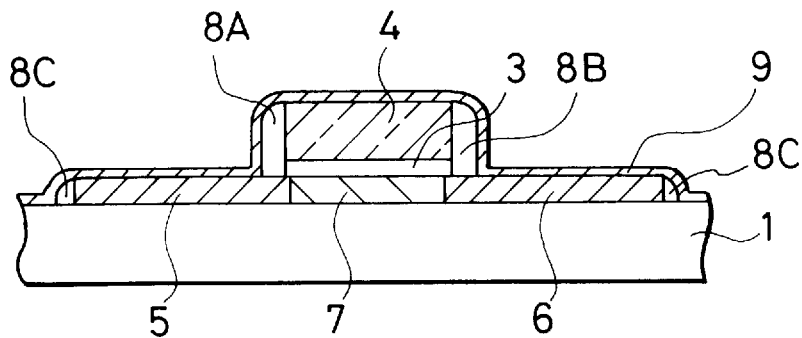

Further, a Ti film 9 with a thickness of 100 Å is formed on the gate electrode 4, the pair of sidewall spacers 8A and 8B and the exposed source and drain regions 5 and 6 over the entire substrate 1 by a sputtering process, as shown in FIG. 3E. The Ti film 9 is then heat-treated in a $N_2$ atmosphere at a temperature ranging from 600° C. to 800° C. for 30 minutes to sinter the film 9. During this process, a silicidation reaction of the polysilicon film 2 with the Ti film 9 occurs at the interfaces of the Ti film 9 with the underlying source and drain regions 5 and 6 and with the gate electrode 4.

Subsequently, the unreacted Ti film 9 and titanium nitride are removed by an etching process. As a result, a titanium silicide ($Ti_{1-x}Si_x$) film 10A is selectively formed at the interface between the source region 5 and an overlying part of the Ti film 9, a titanium suicide film 10B is selectively formed at the interface between the drain region 6 and an overlying part of the Ti film 9, and a titanium silicide film 10C is selectively formed at the interface between the gate electrode 4 and an overlying part of the Ti film 9. The state at this stage is shown in FIG. 3F.

Figure 3F:
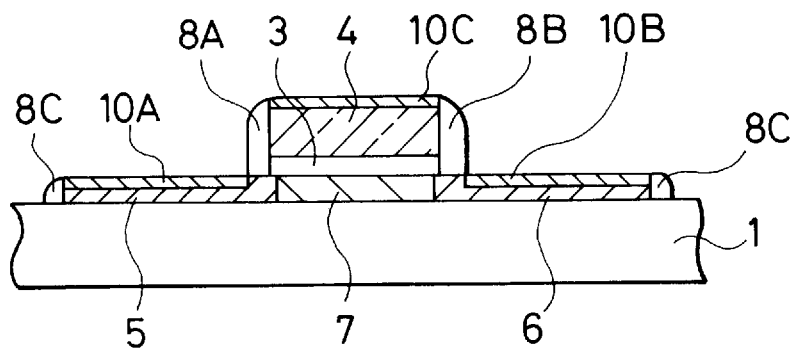

As seen from FIG. 3F, the titanium silicide films 10A and 10B placed on the source and drain regions 5 and 6 are in self-alignment to the gate electrode 4 and the pair of sidewall spacers 8A and 8B. The titanium silicide film 10C placed at the gate electrode 4 is separated from the titanium silicide films 10A and 10B by the pair of sidewall spacers 8A and 8B.

An interlayer insulator film 11 such as a boro-phosphor-silicate glass (BPSG) film is formed to cover the entire substrate 1. The film 11 is patterned to have penetrating contact holes at positions right over the titanium silicide films 10A and 10B, respectively, as shown in FIG. 3G.

Further, a conductive film such as an aluminum (Al) film is formed on the patterned interlayer insulator film 11. The conductive film is patterned to thereby form wiring or interconnection conductors 12A and 12B. As shown in FIG. 3G, the interconnection conductor 12A is contacted with the underlying titanium silicide film 10A through the corresponding contact hole of the interlayer insulator film 11 and as a result, the conductor 12A is electrically connected to the source region 5. Similarly, the interconnection conductor 12B is contacted with the underlying titanium silicide film 10B through the corresponding contact hole of the interlayer insulator film 11 and as a result, the conductor 12B is electrically connected to the drain region 6.

Finally, the substrate 1 and its overlying structure are placed in a vacuum chamber. Then, the silicon film 2 is heat-treated in a plasma of hydrogen ($H_2$) at a temperature of 350° C. to 450° C. for passivation. During this process, the dangling or unsaturated bonds of the silicon atoms in the polysilicon film 2 are filled with the activated hydrogen atoms. Thus, the channel region 7 in the polysilicon film 2 is fully passivated.

Figure 3G:
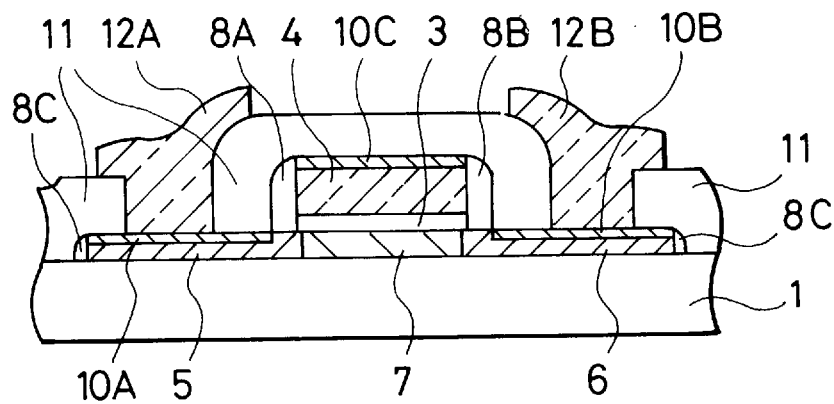

Through the above process steps, the polysilicon TFT having the polysilicon film 2 as the "semiconductor active film" is fabricated on the quartz glass substrate 1, as shown in FIG. 3G.

With the fabrication method according to the first embodiment, since the channel region 7 has a thickness of 300 Å (which is less than 500 Å), the above problem due to the back channel does not occur.

Also, since the Ti film 9 has a thickness of 100 Å less than that (300 Å) of the polysilicon film 2 serving as the "semiconductor active film", the silicide films 10A and 10B can be produced without raising any defects such as agglomeration, cracks and voids, even if the polysilicon film 2 has a thickness of less than 500 Å. Therefore, the electric resistance reduction of the source and drain regions 5 and 6 is ensured and realized.

Figure 4:
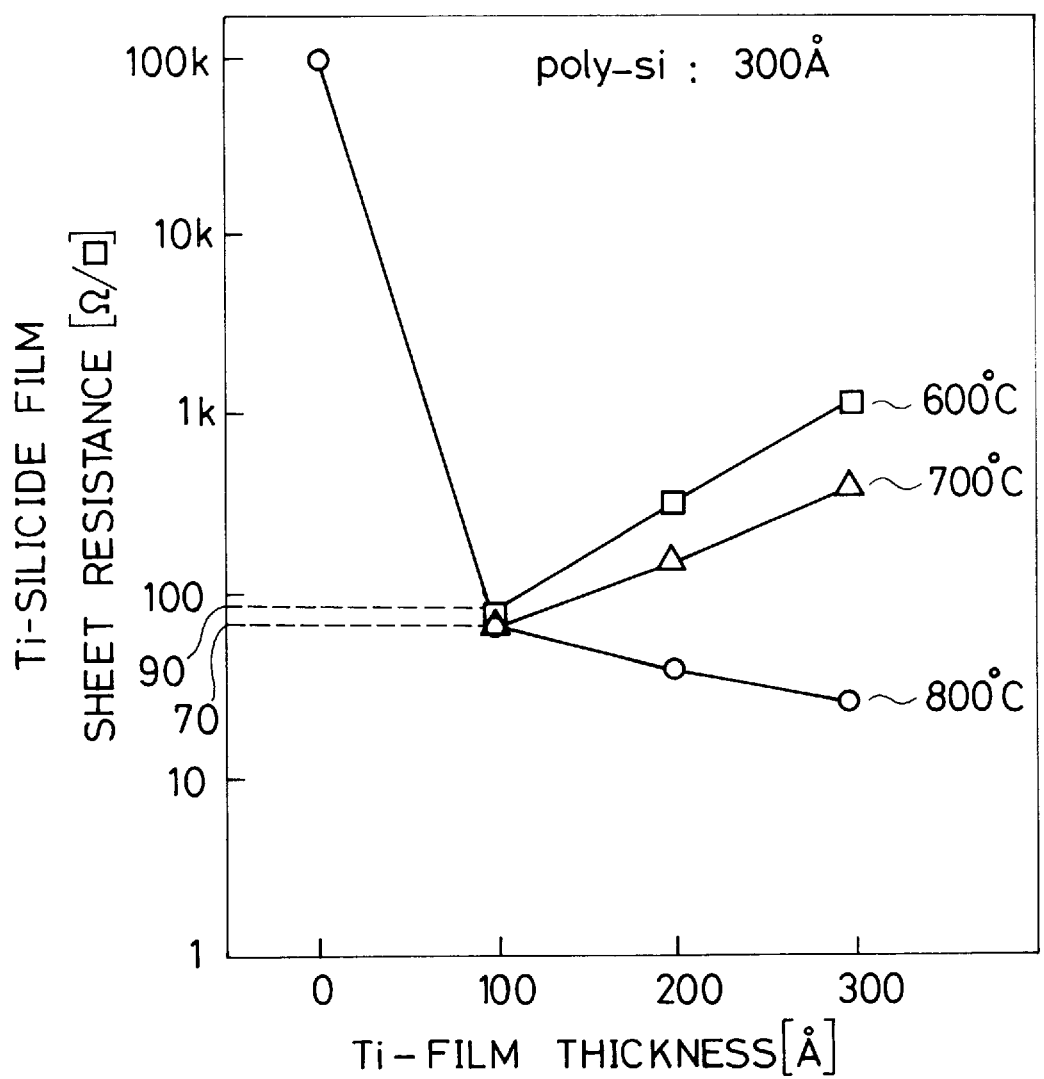
FIG. 4 is a graph showing a relationship between the sheet resistance of a titanium silicide film and the thickness of a titanium film in the fabrication method according to the first embodiment of the invention.

FIG. 4 shows a relationship between the sheet resistance of the Ti silicide films 10A and 10B formed on the source and drain regions 5 and 6 and the thickness of the Ti film 9. In FIG. 4, the symbol ○ indicates the case where the heat-treating or sintering temperature of the Ti film 9 is 800° C., the symbol Δ indicates the case of 700° C. and the symbol □ indicates the case of 600° C. The thickness of the polysilicon film 2 is 300 Å.

The following fact is seen from FIG. 4:

When the thickness of the Ti film 9 is over 100 Å, the sheet resistance of the titanium silicide films 10A and 10B varies dependent upon the sintering temperature. However, when the thickness of the Ti film 9 is equal to 100 Å, the sheet resistance of the titanium silicide films 10A and 10B is kept at a constant value of 70 Ω/□ to 90 Ω/□ independent of the sintering temperature.

Figure 5:
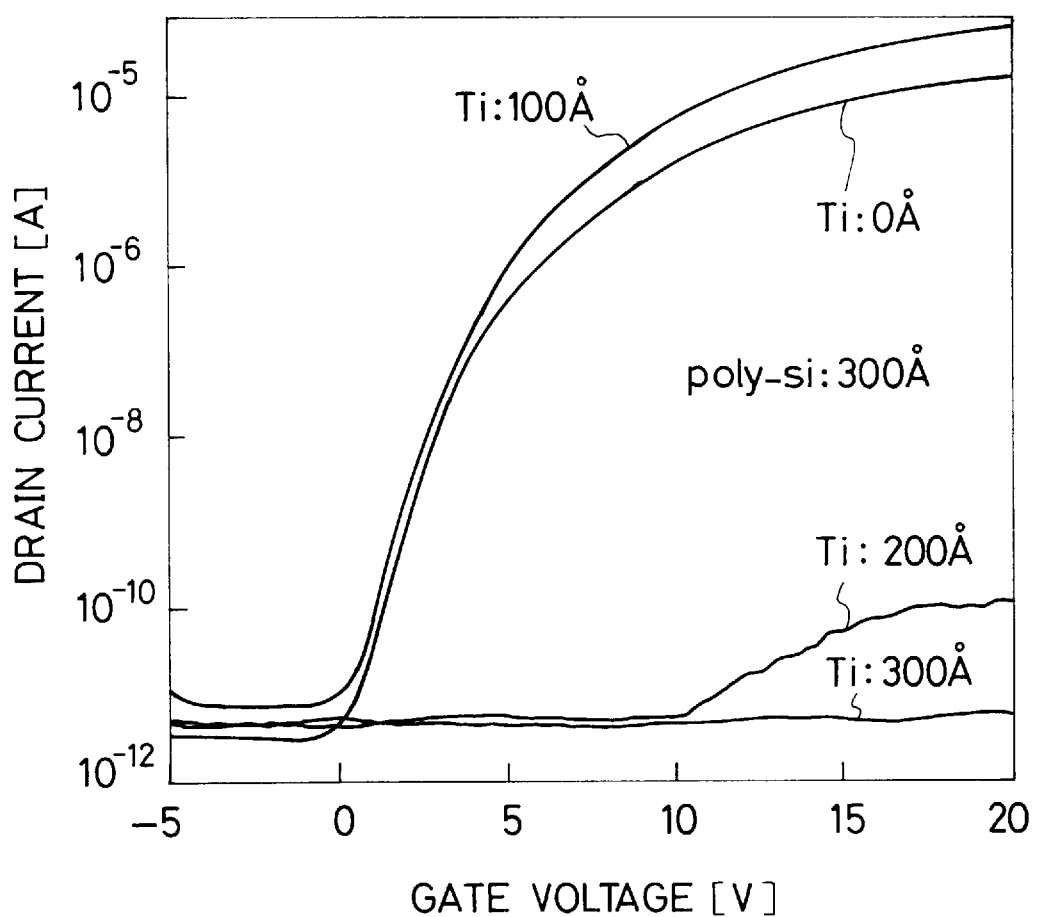
FIG. 5 is a graph showing a relationship between the drain current and the gate voltage of a polysilicon TFT fabricated by the fabrication method according to the first embodiment of the invention.

FIG. 5 shows a relationship between the drain current ($I_d$) and the gate voltage ($V_g$), in other words, the drain current-gate voltage characteristic, of the above polysilicon TFT.

It is seen from FIG. 5 that when the thickness of the Ti film 9 is 200 Å or 300 Å, the drain current $I_d$ scarcely flows through the TFT even if the applied gate voltage $V_g$ is varied. This is due to voids generated at the interfaces between the titanium silicide films 10A and 10B and the source and drain regions 5 and 6 or agglomeration of the titanium silicide films 10A and 10B.

On the other hand, it is seen from FIG. 5 that when the thickness of the Ti film 9 is 100 Å, the drain current $I_d$ increases with the increasing applied gate voltage $V_g$, and that the value of the drain current $I_d$ is greater than that of the case where no silicidation is performed by approximately one digit.

The above graphs shown in FIGS. 4 and 5 were obtained by tests performed by the inventor using the TFT fabricated by the method according to the first embodiment.

Although the heat-treatment or sintering process of the Ti film 9 is performed at a temperature ranging from 600° C. to 800° C. in the above tests, it was found that the same results were obtained even when the temperature was 800° C. to 900° C.

SECOND EMBODIMENT

Figure 6A:
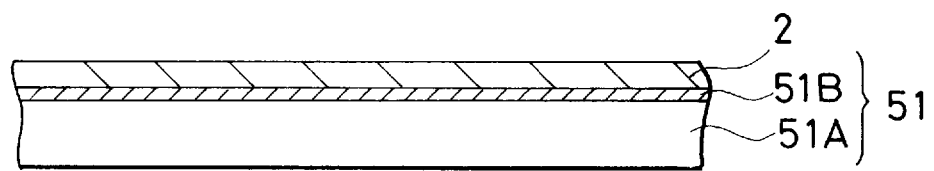
FIGS. 6A and 6B are partial cross-sectional views showing a fabrication method of a semiconductor device according to a second embodiment of the invention, respectively.
Figure 6B:
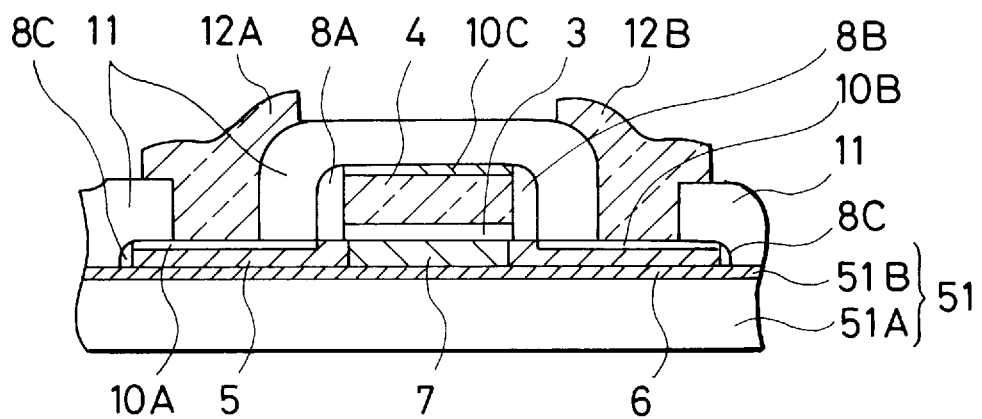

Next, a fabrication method of a semiconductor device according to a second embodiment is described below referring to FIGS. 6A, 6B and 7. FIGS. 6A and 6B correspond to FIGS. 3A and 3G, respectively. In this embodiment, the device is a MOSFET with the SOI structure.

The method of the second embodiment is the same as that of the first embodiment except that the polysilicon film 2 serving as the "semiconductor active film" is formed on a $SiO_2$ film 51B, and that the $SiO_2$ film 51B is formed on a bulk single-crystal silicon substrate 51A, as shown in FIG. 6A. Therefore, the description about the same process steps as those in the first embodiment is omitted here for the sake of simplification by attaching the same reference numerals as those in the first embodiment to the corresponding elements.

The single-crystal silicon substrate 51A and the $SiO_2$ film 51B constitute an insulating substructure 51 in this embodiment.

Figure 7:
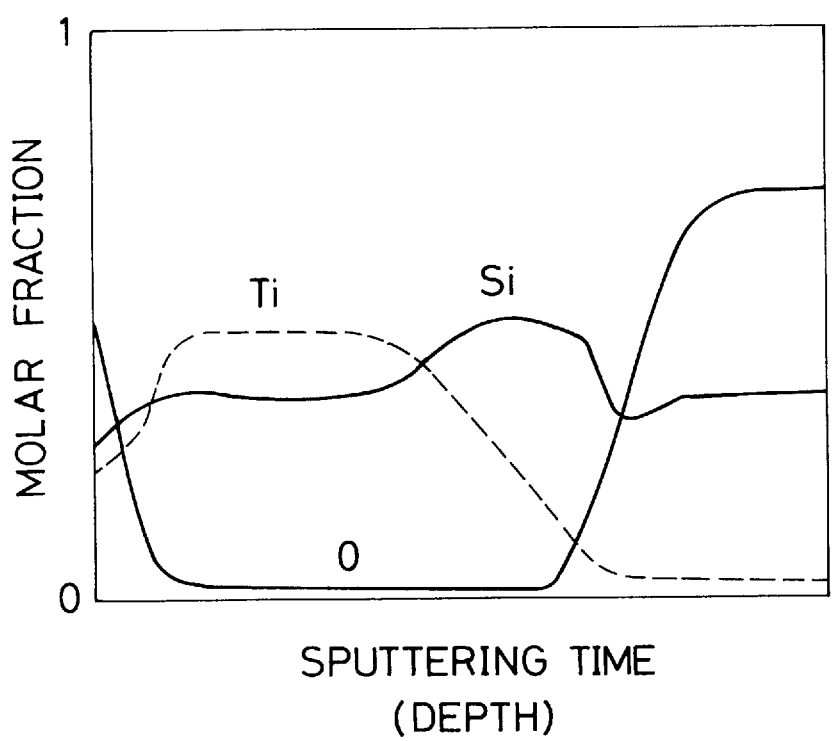
FIG. 7 is a graph showing the relationship between the molar fraction of a silicide film and the sputtering time (i.e., the depth or thickness of the silicide film) fabricated by the fabrication method according to the second embodiment of the invention.

FIG. 7 shows the relationship between the molar fraction of the titanium silicide films 10A, 10B and 10C and the depth (i.e., the distance in the film-thickness direction of the film 3) fabricated by the method according to the second embodiment. In FIG. 7, the components of titanium (Ti), silicon (Si) and oxygen (O) are indicated. This result was obtained through a test performed by the inventor using the technique of Auger electron spectroscopy (AES).

It is seen from FIG. 7 that the titanium silicide films 10A, 10B and 10C have a titanium-rich composition which is expressed as $Ti_5Si_3$ or TiSi. The most stable composition of titanium silicide is typically expressed as $TiSi_2$. However, in the method of the second embodiment, the titanium silicide films 10A, 10B and 10C have a different composition expressed as $Ti_5Si_3$ or TiSi, the reason of which is considered as follows:

Since the polysilicon film 2 has a thickness as small as 300 Å, some stress is applied to the film 2 during the silicidation reaction, thereby producing the thin titanium silicide films 10A, 10B and 10C as above without agglomeration.

It was confirmed by the inventor that even if the titanium silicide films 10A, 10B and 10C have the titanium-rich composition of $Ti_5Si_3$ or TiSi, they provided a satisfactorily low sheet-resistance and had good heat-resistant properties.

Additionally, it was also confirmed by the inventor that even the titanium silicide films 10A, 10B and 10C having a silicon-rich composition could provide a satisfactorily low sheet-resistance and good heat-resistant properties.

With the method according to the second embodiment, since the process steps are substantially the same as those in the first embodiment, the same advantage as that of the first embodiment is obtained.

THIRD EMBODIMENT

FIGS. 8A to 8D show a fabrication method of a semiconductor device according to a third embodiment, in which a storage cell of a static random-access memory (SRAM) is provided.

In the method according to the third embodiment, the following process steps are performed.

Figure 8A:
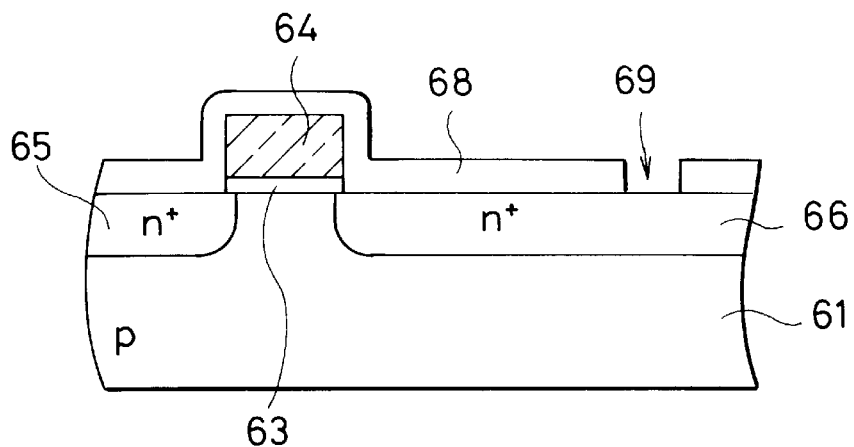
FIGS. 8A to 8D are partial cross-sectional views showing a fabrication method of a semiconductor device according to a third embodiment of the invention, respectively.

First, as shown in FIG. 8A, an n$^+$-type source region 65 and an n$^+$-type drain region 66 are formed to be apart from each other in a p-type single-crystal silicon substrate 61. A gate insulator film 63 made of SiO$_2$ is selectively formed on the substrate 61 between the source and drain regions 65 and 66. A polysilicon gate electrode 64 is formed on the gate insulator film 63.

The source and drain regions 65 and 66 and the gate electrode 64 constitute an n-channel MOSFET. This MOSFET serves as a gate transistor of the storage cell of the SRAM.

Next, an insulator film 68 made of SiO$_2$ is formed to cover the gate electrode 64 and the exposed surface of the substrate 61. The film 68 is then patterned to have a penetrating contact hale 69 at a position right over the drain region 66. The state at this stage is shown in FIG. 8A.

Figure 8B:
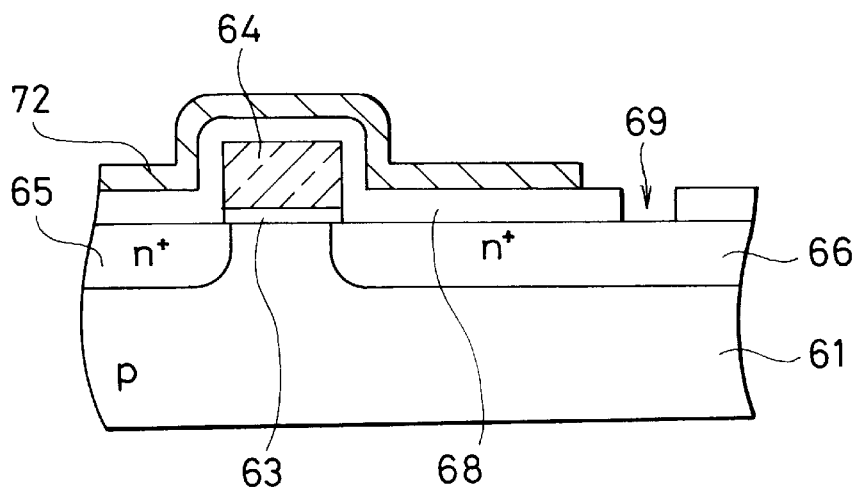

A polysilicon film 72 with a thickness of 300 Å is deposited on the patterned insulator film 68 in the same manner as that of the first embodiment. The polysilicon film 72, which serves as a "semiconductor active film", is then patterned to laterally isolate a device region for the storage cell from the other devices provided at the same polysilicon film 72, as shown in FIG. 8B.

The insulator film 68 and the underlying structure constitutes an insulating substructure in the third embodiment.

Figure 8C:
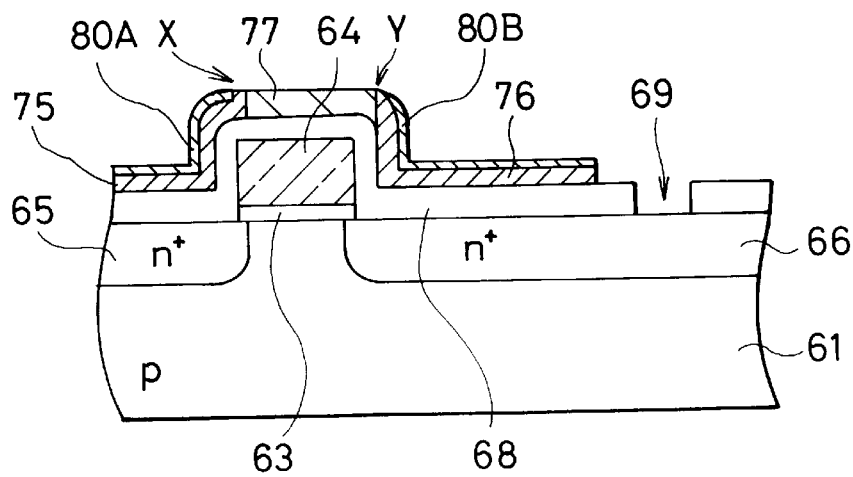

An impurity is selectively ion-implanted into the patterned polysilicon film 72 using a masking film (not shown). Thus, a source region 75 and a drain region 76 are formed to be apart from each other in the polysilicon film 72, as shown in FIG. 8C. The source and drain regions 75 and 76 are used for a p-type TFT formed to be stacked on the MOSFET. This TFT serves as a load transistor for the MOSFET. The remaining polysilicon film 72 other than the source and drain regions 75 and 76 constitutes a channel region 77.

The dose of the impurity or dopant ions and the doping concentration of the source and drain regions 75 and 76 may be the same as those in the first embodiment.

Subsequently, a Ti film (not shown) with a thickness of 100 Å is selectively formed on the polysilicon film 72 thus ion-implanted by a sputtering process using a masking film (not shown). The Ti film is then heat-treated in the same manner as that of the first embodiment to sinter the Ti film. During this process, a silicidation reaction of the polysilicon film 72 with the Ti film occurs at the interfaces of the Ti film with the underlying source and drain regions 75 and 76.

The unreacted Ti film and titanium nitride are removed by an etching process. As a result, a titanium silicide (Ti$_{1-x}$Si$_x$) film 80A is selectively formed at the interface between the source region 75 and an overlying part of the Ti film. Similarly a titanium silicide film 80B is selectively formed at the interface between the drain region 76 and an overlying part of the Ti film. The state at this stage is shown in FIG. 8C.

As seen from FIG. 8C, on the border X of the source region 75 near the channel region 77, the inner end of the titanium silicide film 80A is apart from the opposing end of the channel region 77. Similarly, on the border Y of the drain region 76 near the channel region 77, the inner end of the titanium silicide film 80B is apart from the opposing end of the channel region 77.

An interlayer insulator film 81 such as a BPSG film is formed to cover the entire substrate 61. The film 81 is patterned to have penetrating contact holes at positions right over the titanium silicide film 80B and the contact hole 69 of the film 68, respectively, as shown in FIG. 8D.

Further, a conductive film such as an Al film is formed on the patterned interlayer insulator film 81. The conductive film is patterned to thereby form a wiring or interconnection conductor 82, As shown in FIG. 8D, the interconnection conductor 82 is contacted with the underlying titanium silicide film 80B for the drain region 76 of the TFT and with the underlying drain region 66 for the MOSFET through the corresponding contact holes of the interlayer insulator film 81, respectively. As a result, the conductor 82 electrically connects the drain regions 76 and 66 to each other.

Finally, the silicon film 72 is heat-treated in the same manner as that of the first embodiment for passivation.

Figure 8D:
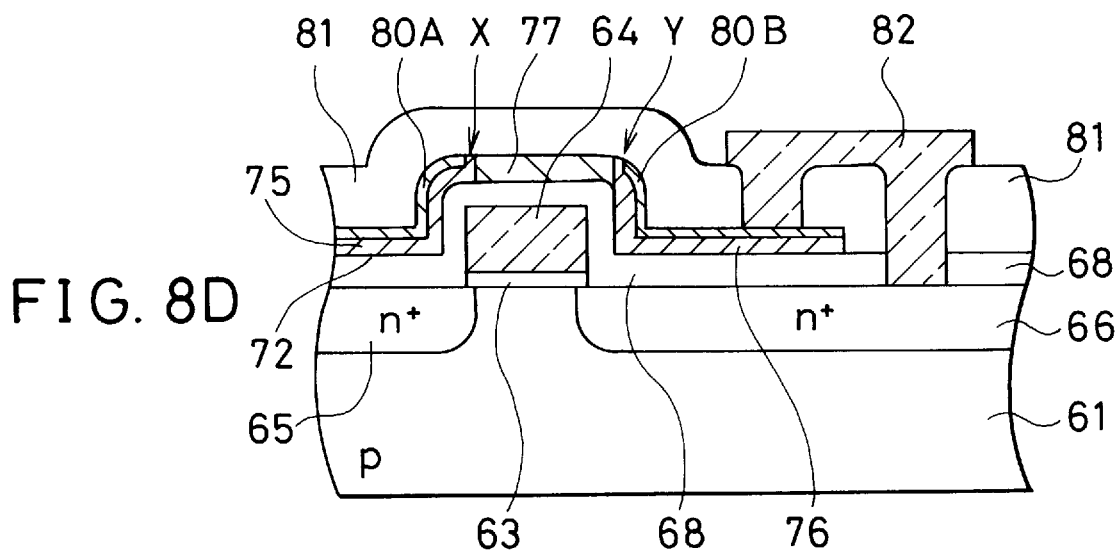

Thus, the SRAM containing the MOSFET and the polysilicon TFT stacked thereon is fabricated on the single-crystal silicon substrate 1, as shown in FIG. 8D.

With the fabrication method according to the third embodiment, the same advantage as that of the first embodiment is obtained.

Although a Ti film is used in the above embodiments as the refractory-metal film, it is needless to say that any other refractory-metal film may be used. For example, Cr, Co, Ni, Nb, Mo, Pd, Ta or W may be used.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, said method comprising the steps of:

forming a semiconductor active film on an insulating substructure, said semiconductor active film having a thickness of at most 500 Å;

selectively forming a gate insulator film on said substructure;

forming a gate electrode on said gate insulator film;

selectively doping an impurity into said semiconductor active film to form a source region and a drain region at each side of said gate electrode, said remaining semiconductor active film constituting a channel region formed between said source region and said drain region;

forming a refractory-metal film to cover said gate electrode, said source region and said drain region, said refractory-metal film having a thickness of (½) to (⅕) times that of said semiconductor active film; and heat-treating said refractory-metal film to produce a first silicide film and a second silicide film through silicidation reaction of said semiconductor active film with said refractory-metal film, said first silicide film constituting a part of said source region and said second silicide film constituting a part of said drain region.

2. The method as claimed in claim 1, wherein said semiconductor active film has a thickness ranging from 500 Å to 250 Å.

3. The method as claimed in claim 1, wherein said step of heat-treating said refractory-metal film is performed in an atmosphere of nitrogen.

4. The method as claimed in claim 1, wherein said step of heat-treating said refractory-metal film is performed in an atmosphere of an inert gas.

5. The method as claimed in claim 1, herein said step of heat-treating said refractory-metal film is performed at a temperature ranging from 600° C. to 900° C.

6. The method as claimed in claim 1, wherein said refractory-metal film is made of at least one selected from the group consisting of Ti, Cr, Co, Ni, Nb, Mo, Pd, Ta and W.

7. The method as claimed in claim 1, wherein said insulating substructure is made of an insulating substrate;

and wherein said source region, said drain region and said gate electrode constitute a TFT.

8. The method as claimed in claim 1, wherein said insulating substructure is made of a combination of a base insulating film and a semiconductor substrate, said base insulating film being formed on said semiconductor substrate;

and wherein said source region, said drain region and said gate electrode constitute an MOSFET with the SOI structure.

9. The method as claimed in claim 1, wherein said insulating substructure is made of an interlayer insulating film and an underlying structure thereof, said underlying structure including an MOSFET;

and wherein said source region, said drain region and said gate electrode constitute a TFT serving as a load of said MOSFET;

and wherein said MOSFET and said TFT constitute a storage cell of a semiconductor memory device.

10. A fabrication method of a semiconductor device, said method comprising the steps of:

forming a gate electrode over a semiconductor substrate via a first gate insulator film;

forming a first source region and a first drain region in said semiconductor substrate, said first source region and said first drain region being aligned with said gate electrode;

forming a covering insulator film covering said first source region, said first drain region and said gate electrode;

forming a semiconductor active film on said covering insulator film located over said first source region, said first drain region and said gate electrode, said semiconductor active film having a thickness of at most 500 Å;

selectively introducing an impurity into said semiconductor active film to form a second source region and a second drain region in said semiconductor active film at each side of said gate electrode, a portion of said semiconductor active film between said second source region and said second drain region serving as a channel region;

selectively forming a refractory-metal film on respective surfaces of said second source region and said second drain region, said refractory-metal film having a thickness, smaller than one-half of a thickness of said semiconductor active film and larger than one-fifth of said thickness of said semiconductor active film; and heat-treating said refractory-metal film to produce a first silicide film and a second silicide film through silicidation reaction of said refractory-metal film with said second source region and said second drain region, said first silicide film constituting a part of said second source region and said second silicide film constituting a part of said second drain region.

11. The method as claimed in claim 10, wherein said second source region, said second drain region and said gate electrode constitute a thin-film transistor;

and wherein said covering insulator film serves as a second gate insulator film.

12. The method as claimed in claim 10, wherein said semiconductor active film has a thickness ranging from 500 Å to 250 Å.

13. The method as claimed in claim 10, wherein said step of heat-treating said refractory-metal film is performed in an atmosphere of nitrogen.

14. The method as claimed in claim 10, wherein said step of heat-treating said refractory-metal film is performed in an atmosphere of an inert gas.

15. The method as claimed in claim 10, wherein said step of heat-treating said refractory-metal film is performed at a temperature ranging from 600° C. to 900° C.

16. The method as claimed in claim 10, wherein said first source region, said first drain region and said gate electrode constitute an MOSFET;

and wherein said second source region, said second drain region and said gate electrode constitute a thin-film transistor, said covering insulator film serving as a second gate insulator film for said thin-film transistor.

17. The method as claimed in claim 10, wherein said first source region, said first drain region and said gate electrode constitutes an MOSFET;

and wherein said second source region, said second drain region and said gate electrode constitute a thin-film transistor serving as a load of said MOSFET;

and wherein said MOSFET and said thin-film transistor constitute a storage cell of a semiconductor memory device.

* * * * *

UNITED STATES PATENT AND TRADEMARK OFFICE
CERTIFICATE OF CORRECTION

PATENT NO.    : 5,807,770
DATED         : September 15, 1998
INVENTOR(S) : Akira Mineji It is certified that error appears in the above-identified patent and that said Letters Patent is hereby corrected as shown below:

Claim 10, Col. 12, line 9, after thickness please delete the ",".

Claim 17, Col. 12, line 46, "constitutes" should be- -constitute- -.

Signed and Sealed this

Fourteenth Day of September, 1999

*Attest:*

Q. TODD DICKINSON

*Attesting Officer*     *Acting Commissioner of Patents and Trademarks*